(12) United States Patent
Yang et al.

(10) Patent No.: US 10,998,227 B2
(45) Date of Patent: *May 4, 2021

(54) METAL INSULATOR METAL CAPACITOR WITH EXTENDED CAPACITOR PLATES

(71) Applicant: International Business Machines Corporation, Armonk, NY (US)

(72) Inventors: Chih-Chao Yang, Glenmont, NY (US); Theodorus E Standaert, Clifton Park, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/732,791

(22) Filed: Jan. 2, 2020

(65) Prior Publication Data

US 2020/0144113 A1    May 7, 2020

Related U.S. Application Data

(62) Division of application No. 16/291,085, filed on Mar. 4, 2019, now Pat. No. 10,559,649, which is a division of application No. 15/971,840, filed on May 4, 2018, now Pat. No. 10,373,866.

(51) Int. Cl.
*H01L 21/8242* (2006.01)
*H01L 21/768* (2006.01)
(Continued)

(52) U.S. Cl.
CPC ...... *H01L 21/76877* (2013.01); *H01L 21/283* (2013.01); *H01L 21/28506* (2013.01);
(Continued)

(58) Field of Classification Search
CPC ..... H01L 23/5223; H01L 28/40; H01L 28/75; H01L 23/642; H01L 28/90; H01L 28/92;
(Continued)

(56) References Cited

U.S. PATENT DOCUMENTS 4,918,500 A    4/1990  Inuishi
5,891,513 A    4/1999  Dubin
(Continued)

FOREIGN PATENT DOCUMENTS

CN    105470225 A    4/2016
KR    20050002028 A    1/2005
(Continued)

OTHER PUBLICATIONS

"Method of Etching Cu in High Aspect Ratio Geometry", Disclosed Anonymously, IPCOM000245402D Mar. 7, 2016.
IBM Patents or Patent Applications Treated as Related.

*Primary Examiner* — Shouxiang Hu
(74) *Attorney, Agent, or Firm* — Jeffrey S LaBaw; Steven J Meyers; Alvin Borromeo

(57) ABSTRACT

A method for fabricating a capacitor structure is described. The method for metal insulator metal capacitor in an integrated circuit device includes forming a first dielectric layer on a substrate. The first dielectric layer has a linear trench feature in which the capacitor is disposed. A bottom capacitor plate is formed in a lower portion of the trench. The bottom capacitor plate has an extended top face so that the extended top face extends upwards in a central region of the bottom capacitor plate metal relative to side regions. A high-k dielectric layer is formed over the extended top face of the bottom capacitor plate. A top capacitor plate is formed in a top, remainder portion of the trench on top of the high-k dielectric layer.

13 Claims, 9 Drawing Sheets

(51) Int. Cl.
   *H01L 49/02* (2006.01)
   *H01L 21/3213* (2006.01)
   *H01L 21/321* (2006.01)
   *H01L 21/283* (2006.01)
   *H01L 21/285* (2006.01)
   *H01L 23/522* (2006.01)
   *H01L 23/64* (2006.01)

(52) U.S. Cl.
   CPC .. *H01L 21/28556* (2013.01); *H01L 21/32115* (2013.01); *H01L 21/32134* (2013.01); *H01L 21/76834* (2013.01); *H01L 21/76865* (2013.01); *H01L 23/5223* (2013.01); *H01L 23/642* (2013.01); *H01L 28/40* (2013.01); *H01L 28/65* (2013.01); *H01L 28/75* (2013.01); *H01L 28/82* (2013.01); *H01L 28/90* (2013.01); *H01L 28/92* (2013.01); *H01L 21/32131* (2013.01)

(58) Field of Classification Search
   CPC ......... H01L 28/82; H01L 28/65; H01L 28/28; H01L 21/76877; H01L 21/76865; H01L 21/283; H01L 21/28556; H01L 21/76834; H01L 21/32134; H01L 21/32115; H01L 21/28506
   See application file for complete search history.

(56) References Cited

U.S. PATENT DOCUMENTS

| | | | |
|---|---|---|---|
| 6,022,796 | A | 2/2000 | Berry |
| 6,143,645 | A | 11/2000 | Hsu |
| 6,335,569 | B1 | 1/2002 | Joshi |
| 6,440,842 | B1 | 8/2002 | Chang |
| 7,086,138 | B2 | 8/2006 | Anderson |
| 7,727,888 | B2 | 6/2010 | Yang |
| 7,781,892 | B2 | 8/2010 | Chen |
| 8,232,196 | B2 | 7/2012 | Yang |
| 8,492,874 | B2 | 7/2013 | Lan |
| 8,569,816 | B2 | 10/2013 | Shroff |
| 8,759,212 | B2 | 6/2014 | Kume |
| 9,337,195 | B2 | 5/2016 | Lin |
| 9,786,550 | B2 | 10/2017 | Gates |
| 10,373,866 | B1 * | 8/2019 | Yang ................ H01L 21/28506 |
| 2002/0121699 | A1 | 9/2002 | Cheng |
| 2003/0003717 | A1 | 1/2003 | Park |
| 2003/0068867 | A1 | 4/2003 | Forster |
| 2004/0077175 | A1 | 4/2004 | Hsieh |
| 2005/0191806 | A1 * | 9/2005 | Gutsche ............. H01L 27/1087 438/243 |
| 2007/0164434 | A1 | 7/2007 | Watanabe |
| 2007/0264770 | A1 | 11/2007 | Lee |
| 2008/0291649 | A1 * | 11/2008 | Mashino .......... H01L 23/49827 361/763 |
| 2010/0219533 | A1 | 9/2010 | Ootake |
| 2012/0193760 | A1 | 8/2012 | Manabe |
| 2014/0327109 | A1 | 11/2014 | Weng |
| 2016/0155686 | A1 | 6/2016 | Lee |
| 2016/0358859 | A1 | 12/2016 | Murray |
| 2017/0263557 | A1 | 9/2017 | Clevenger |
| 2019/0164887 | A1 | 5/2019 | Wang |

FOREIGN PATENT DOCUMENTS

| | | | |
|---|---|---|---|
| KR | 20060061039 | A | 6/2006 |
| KR | 100842466 | B1 | 6/2008 |

* cited by examiner

METAL INSULATOR METAL CAPACITOR WITH EXTENDED CAPACITOR PLATES

BACKGROUND OF THE INVENTION

This disclosure relates to integrated circuit devices, and more specifically, to a method and structure to improve the capacitance of metal insulator metal capacitors in semiconductor devices.

In many applications in integrated circuits, high performance, high speed capacitors are required. A metal insulator metal (MIM) capacitor is one commonly used capacitor in high performance applications in semiconductor technologies. An MIM capacitor has a sandwich structure wherein capacitor top metal (CTM) is separated from the capacitor bottom metal (CBM) by a thin insulating layer. Both of the two parallel metal plates are conventionally made from copper, aluminum or their alloys. These metals are patterned and etched needing several photolithography masking steps. The thin insulating dielectric layer is usually made from silicon oxide or silicon nitride deposited by chemical vapor deposition (CVD) or other deposition processes.

The dimensions of modern integrated circuitry in semiconductor chips continues to become smaller, it can become more difficult to design a capacitor having the necessary capacitance in these smaller structures due to the limited insulator and electrode contact area. As the needed devices for a given chip design compete for the available chip area, it can be desirable to increase the capacitance of the capacitor while minimizing the horizontal footprint area devoted to the capacitor.

The present disclosure presents an advanced MIM capacitor design to alleviate this problem.

BRIEF SUMMARY

According to this disclosure, a method for fabricating a capacitor structure is described. The method for metal insulator metal capacitor in an integrated circuit device includes forming a first dielectric layer on a substrate. The first dielectric layer has a linear trench feature in which the capacitor is disposed. A bottom capacitor plate is formed in a lower portion of the trench. The bottom capacitor plate has an extended top face so that the extended top face extends upwards in a central region of the bottom capacitor plate metal relative to side regions. A high-k dielectric layer is formed over the extended top face of the bottom capacitor plate. A top capacitor plate is formed in a top, remainder portion of the trench on top of the high-k dielectric layer.

The foregoing has outlined some of the more pertinent features of the disclosed subject matter. These features should be construed to be merely illustrative. Many other beneficial results can be attained by applying the disclosed subject matter in a different manner or by modifying the invention as will be described.

BRIEF DESCRIPTION OF THE DRAWINGS

For a more complete understanding of the present invention and the advantages thereof, reference is now made to the following descriptions taken in conjunction with the accompanying drawings which are not necessarily drawing to scale, and in which.

DETAILED DESCRIPTION OF THE DRAWINGS

Figure 1:
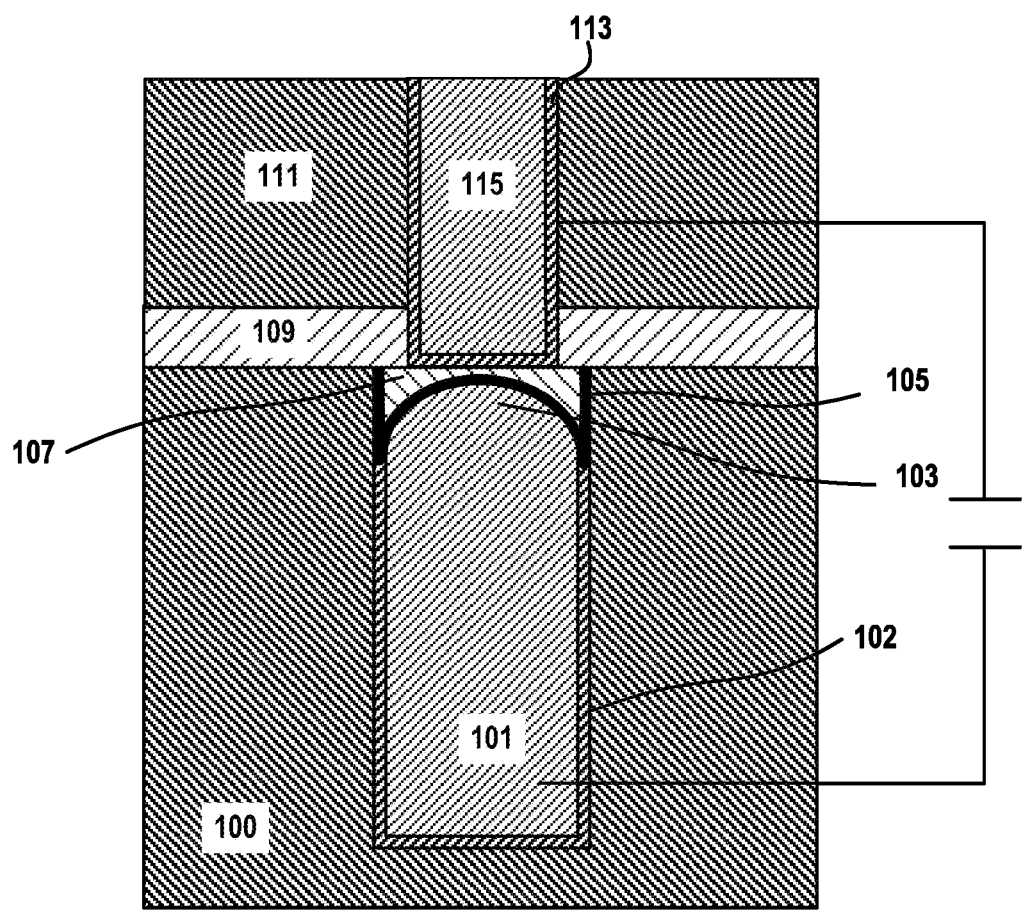
FIG. 1 is a cross-sectional diagram illustrating a capacitor structure built according to a first embodiment of the process.

At a high level, embodiments of the invention provide an increased capacitor plate area for a metal insulator metal capacitor given the same horizontal footprint as a conventional capacitor. This is achieved by forming a curved, ridge line or otherwise extended top face of the bottom capacitor plate in a trench feature. The extended top face extends upwards in a central region of the bottom capacitor plate relative to the side regions of the bottom capacitor plate. A high-k dielectric covers the bottom capacitor plate which is in turn covered by a top capacitor plate. Both the high-k dielectric and the top capacitor plate will mirror the extended top face feature created in the top face of the bottom capacitor plate. The greater contact area provided by the extended top face feature improves the capacitance of the MIM capacitor relative to an MIM capacitor built in the same footprint using flat capacitor plates.

A "substrate" as used herein can comprise any material appropriate for the given purpose (whether now known or developed in the future) and can comprise, for example, Si, SiC, SiGe, SiGeC, Ge alloys, GaAs, InAs, InP, other III-V or II-VI compound semiconductors, or organic semiconductor structures. Insulators can also be used as substrates in embodiments of the invention.

For purposes herein, a "semiconductor" is a material or structure that may include an implanted impurity that allows the material to sometimes be conductive and sometimes be a non-conductive, based on electron and hole carrier concentration. As used herein, "implantation processes" can take any appropriate form (whether now known or developed in the future) and can comprise, for example, ion implantation.

For purposes herein, an "insulator" is a relative term that means a material or structure that allows substantially less (<95%) electrical current to flow than does a "conductor." The dielectrics (insulators) mentioned herein can, for example, be grown from either a dry oxygen ambient or steam and then patterned. As discussed in the specification, the dielectrics are considered high dielectric constant (high-k) materials, including but not limited to hafnium oxide, aluminum oxide, silicon nitride, silicon oxynitride, a gate dielectric stack of SiO2 and Si3N4, and metal oxides like tantalum oxide that have relative dielectric constants above that of SiO2 (above 3.9). Dielectrics with low dielectric constants, e.g., SiO2, have relative dielectric constants of 3.8 or below. Representative low-k dielectrics have dielectric constants equal or lower than 3.5. Example of low-k dielectrics include porous SiO2, and carbon doped SiO2. The dielectric can be a combination of two or more of these materials. The thickness of dielectrics herein may vary contingent upon the required device performance.

The conductors mentioned herein can be formed of any conductive material, such as polycrystalline silicon (polysilicon), amorphous silicon, a combination of amorphous silicon and polysilicon, and polysilicon-germanium, rendered conductive by the presence of a suitable dopant. Alternatively, the conductors herein may be one or more metals, such as tungsten, hafnium, tantalum, molybdenum, titanium, or nickel, or a metal silicide, any alloys of such metals, and may be deposited using physical vapor deposition, chemical vapor deposition, or any other technique known in the art.

"Electrically conductive" and/or "electrical conductor" as used through the present disclosure means a material typically having a room temperature resistivity less than about 400μ Ω-cm. As used herein, the terms "insulator" and "dielectric" denote a material having a room temperature resistivity greater than about 400μ Ω-cm.

When patterning any material herein, the material to be patterned can be grown or deposited in any known manner and a patterning layer (such as an organic photoresist aka "resist") can be formed over the material. The patterning layer (resist) can be exposed to some form of light radiation (e.g., patterned exposure, laser exposure) provided in a light exposure pattern, and then the resist is developed using a chemical agent. This process changes the characteristic of the portion of the resist that was exposed to the light. Then one portion of the resist can be rinsed off, leaving the other portion of the resist to protect the material to be patterned. A material removal process is then performed (e.g., plasma etching) to remove the unprotected portions of the material to be patterned. The resist is subsequently removed to leave the underlying material patterned according to the light exposure pattern.

For purposes herein, "sidewall structures" are structures that are well-known to those ordinarily skilled in the art and are generally formed by depositing or growing a conformal insulating layer (such as any of the insulators mentioned above) and then performing a directional etching process (anisotropic) that etches material from horizontal surfaces at a greater rate than its removes material from vertical surfaces, thereby leaving insulating material along the vertical sidewalls of structures. This material left on the vertical sidewalls is referred to as a sidewall structure. The sidewall structures can be used as masking structures for further semiconducting processing steps.

Embodiments will be explained below with reference to the accompanying drawings.

FIG. 1 is a cross-sectional diagram illustrating a capacitor structure built according to a first embodiment of the process. A first dielectric layer 100 is patterned to provide a recess, i.e., a linear trench, for the bottom capacitor plate 101. In preferred embodiments, a barrier layer 102 is formed to prevent diffusion of the metal which makes up the bottom capacitor plate 101 into the dielectric layer 100. An extended top surface 103 of the bottom capacitor plate 101 provides an increased capacitor plate area, as compared to a flat top surface built within the same trench, increasing the capacitance of the MIM capacitor. In this embodiment, the extended top surface 103 is rounded, extending upward or convex with respect to the bottom capacitor plate 101. In the various profiles of different embodiments, the extended top face extends upwards in a central region of the bottom capacitor plate relative to side regions of the bottom capacitor plate.

A high-k dielectric layer 105 is deposited on top of the extended top surface 103. A top capacitor plate 107 is formed on top of the high-k dielectric layer 105 and fills the top, remainder portion of the trench feature in the first dielectric layer 100. The high-k dielectric layer 105 and the top capacitor plate 107 form a concave structure with reference to the top capacitor plate 107 material, following the convex contour of the extended top surface 103 207 of the first level metal. The high-k dielectric 107 also separates the top capacitor plate 107 from the dielectric layer 100.

As shown, a second layer of dielectric 111 is formed over a dielectric capping layer 109 over the top capacitor plate 107. The second dielectric 111 is patterned to provide the recess for the contact 115, e.g., a via contact, to the top capacitor plate 107.

A single structure at a first and a second level is shown for ease in illustration, however, multiple MIM capacitors are typically formed in a given interconnection structure. The MIM capacitor structure can be provided at any or all of the plurality of levels of the interconnect structure. Further, for ease in illustration, the embedded devices in the substrate beneath the first dielectric layer 100 are not shown but the substrate could contain nFETs, pFETs and isolation dielectrics. The dielectric layers are silicon dioxide in preferred embodiments, however, other dielectric materials or multilayer dielectric structures comprising a plurality of dielectric materials are used in other embodiments of the invention. Typically, the dielectric layers 100 and 111 have respective thicknesses from 50 nm to 1200 nm with thicknesses from 80 nm to 500 nm being more preferred, but this is largely dependent on the interconnection technology used.

The formation of the first embodiment of the interconnect structure will now be discussed in more detail in reference to FIGS. 2-8.

Figure 2:
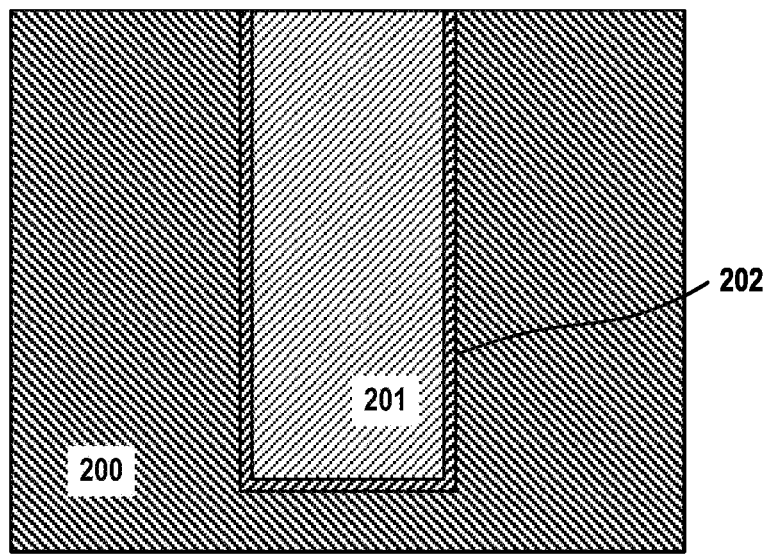
FIG. 2 is a cross-sectional diagram illustrating a capacitor structure built according to a first embodiment of the process after a barrier layer and bottom capacitor plate deposition.

FIG. 2 is a cross-sectional diagram illustrating a capacitor structure built according to a first embodiment of the process after a barrier layer, a bottom capacitor plate deposition and a planarization step have been performed. The first level dielectric layer 200 has been patterned with a trench in which a metal layer which will form the bottom capacitor plate 201, and optionally a barrier layer 201, have been deposited. The first dielectric layer 200 is $SiO_2$ in preferred embodiments, but other dielectrics such as Si3N4, organosilicates, porous dielectrics, or multilayered dielectrics are used in alternative embodiments.

As is known, to form a trench pattern in a dielectric, a photoresist or sacrificial mandrel layer is first patterned over the dielectric layer. A subsequent etch, such as a reactive ion etch (RIE) process, is used to create the trench feature in the dielectric in which the first level metal layer 201 and barrier layer 202 are deposited.

The first level metal layer 201 and barrier layer 202 are deposited in one or more of a variety of processes known to the art (or invented in the future). The deposition processes include, for example, chemical vapor deposition (CVD), plasma enhanced chemical vapor deposition (PECVD), physical vapor deposition (PVD) or sputtering. Typical first level metals include Cu, Al, Co, W, Ta, Ti, Rh, Ru, Ni, Ir and nitrides or alloys of the same. However, other metals can be used. Typical diffusion barrier layers include TaN, Ta, Ti, TiN, W, Ru, Ir, although other barrier layers are known to the art and are used in alternative embodiments of the invention. Diffusion barrier layers are used when diffusion of the first level metal into the dielectric is a concern. In embodiments of the invention, the barrier layer 202 has a thickness from 1 nm to 100 nm with a thickness from 2 nm to 50 nm being more typical.

After the deposition of the first level metal layer 201 and barrier layer 202, a planarization step is used to remove the layers on the top surfaces of the field areas of the dielectric 200 outside the trench feature resulting in the structure shown in FIG. 2. A chemical mechanical polishing (CMP) step is a widely used planarization process which is used in embodiments of the invention. A CMP process uses an abrasive and corrosive chemical slurry (commonly a colloid) in conjunction with a polishing pad. The pad and wafer are pressed together by a polishing head and held in place by a plastic retaining ring. Other planarization processes are known to the art and are used in alternative embodiments of the invention.

Figure 3:
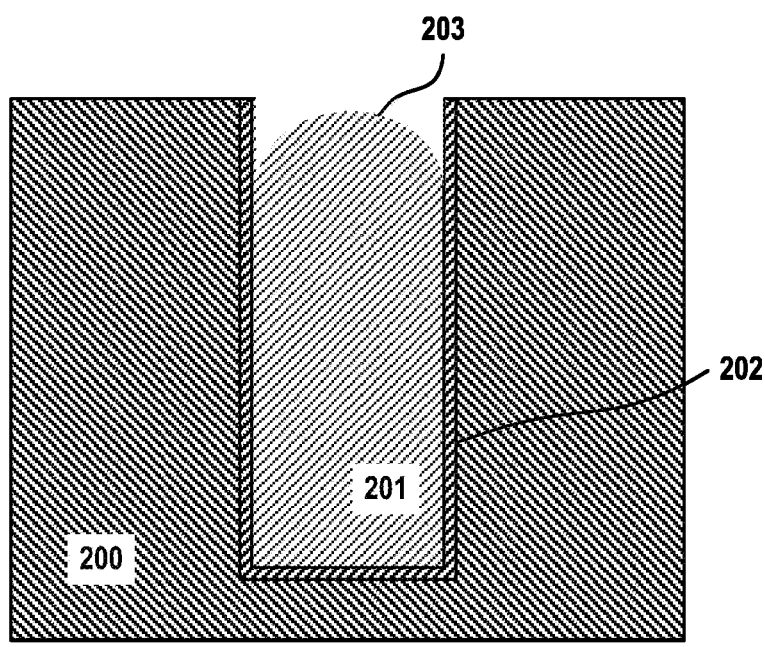
FIG. 3 is a cross-sectional diagram illustrating a capacitor structure built according to a first embodiment of the process after a rounded surface is formed on the top surface of the bottom capacitor plate.

FIG. 3 is a cross-sectional diagram illustrating a capacitor structure built according to a first embodiment of the process after a rounded surface is formed on the top surface of the bottom capacitor plate. In one embodiment of the invention, a combination wet etch and reactive ion etch (RIE) process is used to form the rounded surface 203 when a copper layer is used for the metal line which is used to form the bottom capacitor plate 201. Where a wet etching sputtering process is performed to create the extended top surface 203, the wet etch chemistry includes DHF, HCl, H2SO4 or HNO3. In other preferred embodiments of the invention, an angular sputtering process is used. The direction of the sputtering/etching process is at a non-perpendicular angle to the wafer surface. By controlling the angle of the etching/sputtering process a variety of extended top surface shapes can be made. In embodiments of the invention, the sputtering direction is between 10 degrees to 80 degrees from the horizontal surface.

The sputtering and etching process is a non-selective process and all of the exposed first metal layer surface will be treated and shaped. Thus, when the invention is used to create a MIM capacitor alongside a convention metal interconnect, a mask, e.g., a photoresist layer (not shown in the drawing), is applied to the metal interconnect. Thus, only the area(s) where the underlying metal layer needs to be shaped, i.e. where the MIM capacitor is to be formed are exposed the sputtering/etching process. As shown in the drawing, the photoresist mask has been removed after the sputtering/etching process has shaped the top surface of the bottom capacitor plate.

In the first embodiment, the top extended surface 203 is rounded, in a convex shape with respect to the bottom capacitor plate 201. As is discussed below, other protuberant shapes are used in alternative embodiments. The invention increases the surface area of the capacitor plates in the capacitor. A greater degree of curvature, i.e. more rounded surface, is preferred over a slightly curved surface for a greater surface area. As is mentioned above, by angling the sputtering direction it is possible to modulate the contours of the top extended surface 203.

The overall height of the first level metal should be decreased during the etch process so that the height of the bottom capacitor is lower than the top surface of the dielectric so that the subsequent high-k dielectric layer and top capacitor plate will fit in the remainder of the trench. In preferred embodiments, the etch/sputtering process is selective to the first level metal, e.g., copper, as compared to the barrier layer, e.g., TaN. As the etching rate for Cu is much faster than on TaN, the top portion of the barrier layer is left on the dielectric above the top extended surface 203 in this embodiment.

Figure 4:
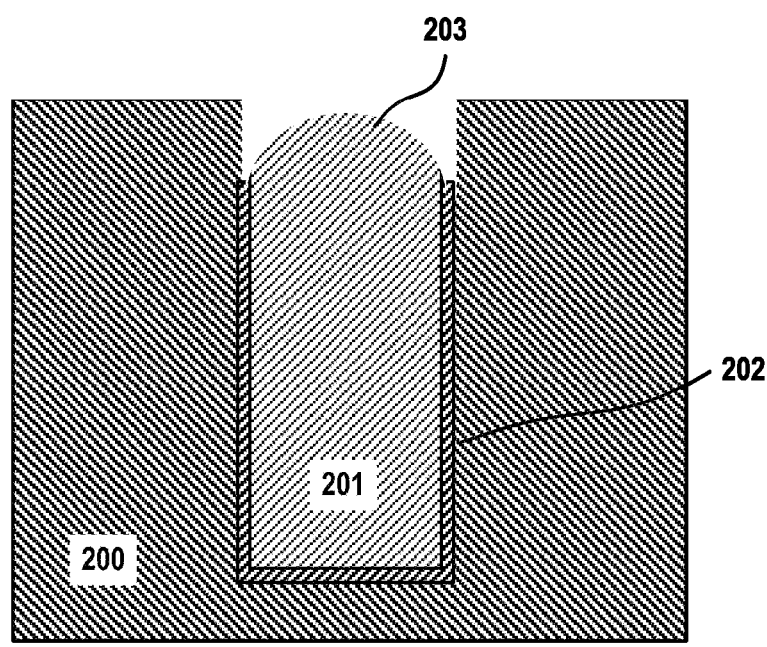
FIG. 4 is a cross-sectional diagram illustrating a capacitor structure built according to a first embodiment of the process after a barrier layer etch back process is performed.

FIG. 4 is a cross-sectional diagram illustrating a capacitor structure built according to a first embodiment of the process after a barrier layer etch back process is performed. In this step, a wet etch process which is selective to the barrier layer 202 as compared to the material which is used for the bottom capacitor plate 201 and the dielectric 200. For example, if copper was used for the bottom capacitor plate 201, TiN was used for the barrier layer 202 and the first dielectric layer 200 was $SiO_2$ a suitable wet etch would be EKC270™-T. In this step, the barrier layer disposed on the sidewall of the dielectric and higher than a location that the extended top face and the barrier layer meet is etched away. The barrier layer between the top capacitor plate and the first dielectric is also a conductor so in the preferred embodiment it should be removed to prevent shorting or a leaky circuit. Different etch processes can be used in different embodiments which use different materials.

Figure 5:
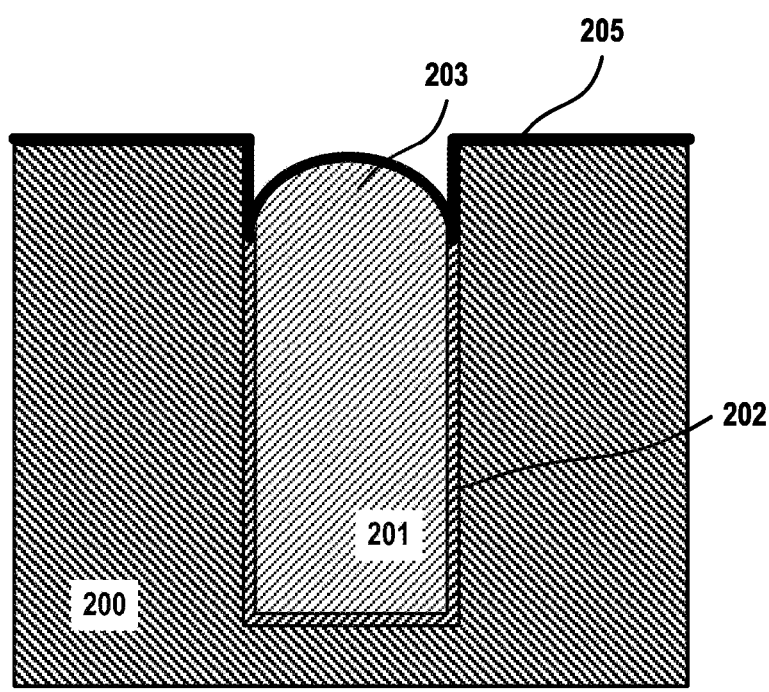
FIG. 5 is a cross-sectional diagram illustrating a capacitor structure built according to a first embodiment of the process after a dielectric layer is formed on the rounded surface of the top surface of the bottom capacitor plate.

FIG. 5 is a cross-sectional diagram illustrating a capacitor structure built according to a first embodiment of the process after a high-k dielectric layer is formed on the rounded top surface of the bottom capacitor plate. An $HfO_2$ layer, or another high-k material, is used for the high-k layer 205. Suitable deposition processes to form the layer include chemical vapor deposition (CVD), atomic layer deposition (ALD), physical vapor deposition (PVD), and spin-on deposition processes. In preferred embodiments, the thickness of the high-k layer 205 will be sufficient to cover the bottom capacitor plate 201 and is in the range of 0.5 nm to 20 nm. In alternative embodiments, other high-k materials such as hafnium silicate ($HfO_4Si$), zirconium silicate ($ZrSiO_4$), hafnium dioxide ($HfO_2$), zirconium dioxide ($ZrO_2$), aluminum oxide ($Al_2O_3$), and yttrium oxide ($Y_2O_3$) are used.

Figure 6:
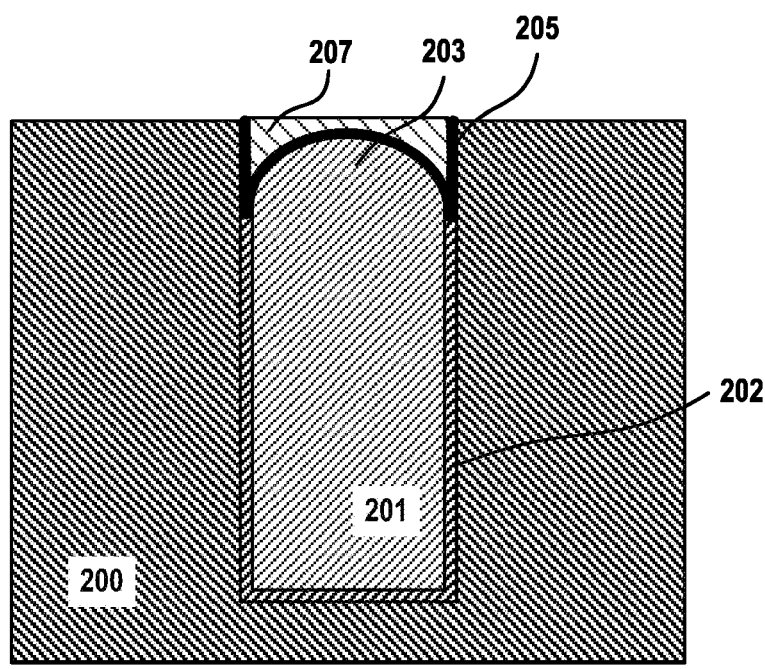
FIG. 6 is a cross-sectional diagram illustrating a capacitor structure built according to a first embodiment of the process after a top capacitor plate is formed on the rounded surface of the top surface of the dielectric layer.

FIG. 6 is a cross-sectional diagram illustrating a capacitor structure built according to a first embodiment of the process after a top capacitor plate is formed on the rounded, top surface of the dielectric layer. In a preferred embodiment, the processes performed in the formation of the top capacitor plate 207 include a metal fill and a planarization process such as CMP. The metal can be formed using the processes discussed above in the formation of the bottom capacitor plate discussed above. The metal used for the top capacitor plate 207 can be the same as that used for the bottom capacitor plate 201. In preferred embodiments, a high conductivity/low resistivity metal such as copper is used. While capacitance is related to k value and contact area, a metal plate with a lower resistivity results in a higher Q value. The quality factor Q is a dimensionless number that is equal to the capacitor's reactance divided by the capacitor's parasitic resistance.

In the drawings, the bottom plate is depicted as much thicker than the top plate. However, in other embodiments of the invention, the thicknesses of the plates are more equal, or the top plate is thicker. That is, the drawings are not necessarily to scale.

In embodiments of the invention, the planarization process is similar to that used to form the structure shown in FIG. 2 in preferred embodiments of the invention.

Figure 7:
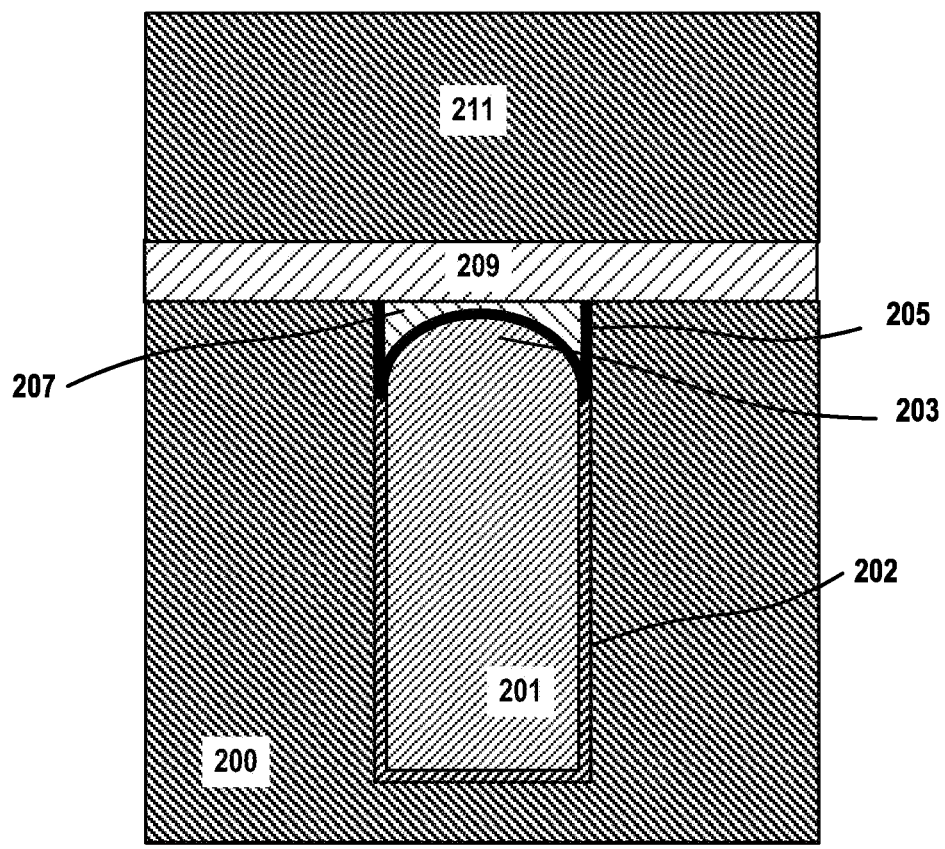
FIG. 7 is a cross-sectional diagram illustrating a capacitor structure built according to a first embodiment of the process after a capping layer and second dielectric layer are formed.

FIG. 7 is a cross-sectional diagram illustrating a capacitor structure built according to a first embodiment of the process after a capping layer and second dielectric layer are formed. The dielectric capping layer 209, is preferably Si3N4, SiC or SiC(N,H) and is formed over the first dielectric layer 200. The capping layer 209 is formed from one of a variety of processes in different embodiments of the invention including chemical vapor deposition (CVD), a plasma enhanced chemical vapor deposition (PECVD), a physical vapor deposition (PVD) or an atomic layer deposition (ALD). A second dielectric layer 211 is deposited over the capping layer 209. The second level dielectric material used for the second dielectric layer 211 can be similar or different from the dielectric material used for the first dielectric layer 200. In preferred embodiments where the MIM capacitor is fabricated in the same level as the interconnect, this dielectric is selected to be compatible or the same as the dielectric used for the interconnect.

Figure 8:
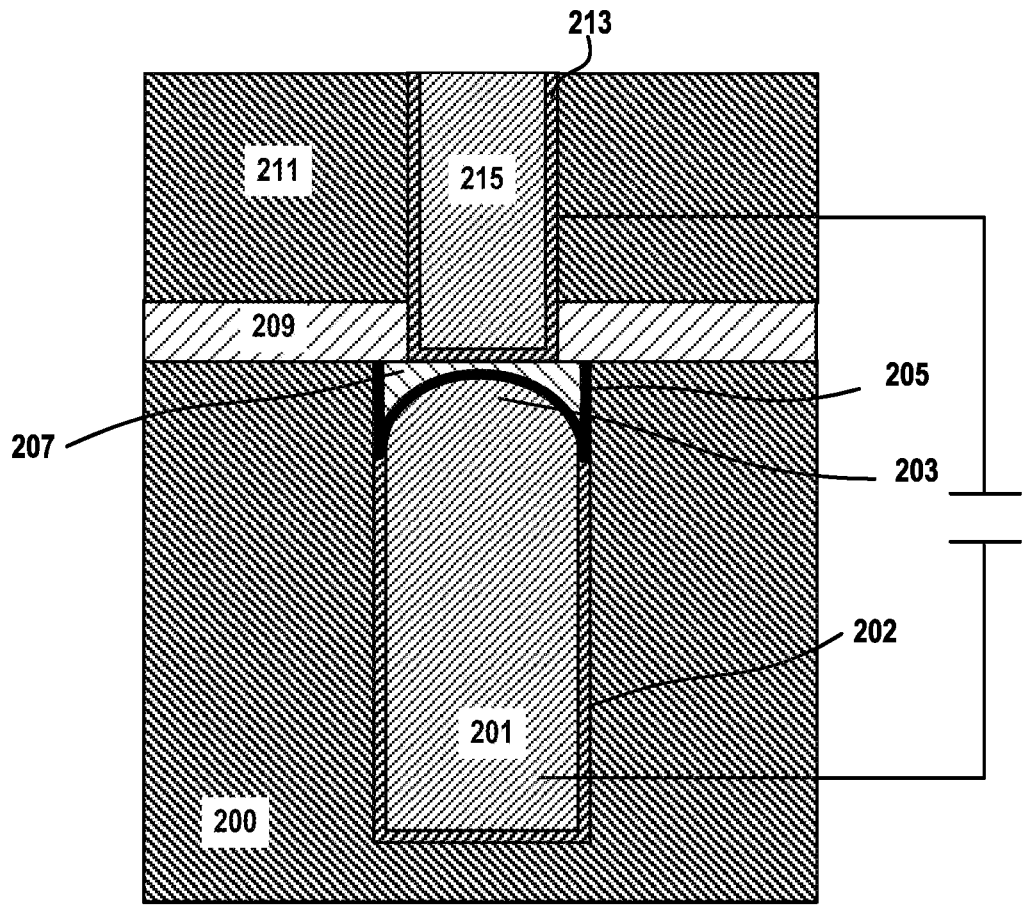
FIG. 8 is a cross-sectional diagram illustrating a capacitor structure built according to a first embodiment of the process after a contact to the top capacitor layer is formed.

FIG. 8 is a cross-sectional diagram illustrating a capacitor structure built according to a first embodiment of the process after a contact to the top capacitor layer is formed. First, a recess is formed with a process known in the art, such as using a lithography mask to expose the recess area and then etch the exposed area using one or more etch processes such as a RIE process. The barrier layer 213 is the same barrier layer material chosen for barrier layer 202 in some embodiments. In other embodiments, the second barrier layer 213 is a different material. The contact metal layer 215 is a suitable metal such as Cu, Al, Co, W, Ru, Ni, and their alloys. Similar processes as described above can be used to deposit these layers. The thickness of the barrier layer 213 and contact metal layer 215 can vary depending on the depth of the trench and the technique used in forming the barrier and metal layers. It is also dependent on design of the interconnect layer in which the capacitor is embedded. Typically, the contact metal layer has an overburden thickness from 100 nm to 1200 nm, with a thickness from 300 nm to 800 nm being more typical.

Figure 9:
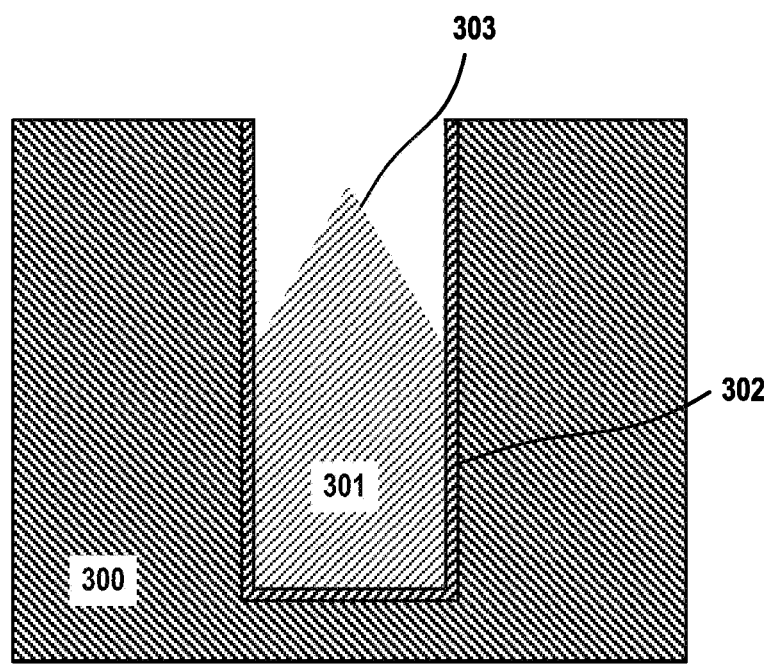
FIG. 9 is a cross-sectional diagram illustrating a capacitor structure built according to a second embodiment of the invention after a ridge line surface of the top surface of the bottom capacitor layer is created.

FIG. 9 is a cross-sectional diagram illustrating a capacitor structure built according to a second embodiment of the invention after a ridge line surface of the top surface of the bottom capacitor layer is created. As compared to the first embodiment, in which a rounded profile is created in the top surface the bottom capacitor plate 301 has ridge line top surface 303 which is more planar on the sides and has a peak at the highest point. One skilled in the art will understand that other embodiments of the invention have other extended shapes in their top surfaces, e.g., a shape somewhere in between that of the first embodiment profile and the second embodiment profile. There is more contact area in the embodiment depicted in FIG. 9 and therefore there is better performance, i.e. higher capacitance in this embodiment. However, the embodiment depicted in FIG. 9 requires more process control and complexity than a slightly rounded profile.

The remainder of the finished capacitor resembles that of the first embodiment except that the interface between the bottom and top capacitor plates follows the ridge line profile.

As is known to the art, the MIM capacitor structure is followed by additional processing to fabricate contacts for structures which attach the chip to a packaging substrate so that the chip can be incorporated into a computing device. After completing the integrated circuits in the wafer, the wafer is diced and the individual chips are placed on their respective substrates.

Although the figures show only two levels for ease in illustration, in an actual device there can be more levels of the interconnection structure.

The resulting structure can be included within integrated circuit chips, which can be distributed by the fabricator in wafer form (that is, as a single wafer that has multiple chips), as a bare die, or in a packaged form. In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

While only a limited number of features are illustrated in the drawings, those ordinarily skilled in the art would understand that many different types of features could be simultaneously formed with the embodiments herein and the drawings are intended to show simultaneous formation of multiple different types of features. However, the drawings have been simplified to only show a limited number of features for clarity and to allow the reader to more easily recognize the different features illustrated. This is not intended to limit the invention because, as would be understood by those ordinarily skilled in the art, the invention is applicable to structures that include many of each type of feature shown in the drawings.

While the above describes a particular order of operations performed by certain embodiments of the invention, it should be understood that such order is exemplary, as alternative embodiments may perform the operations in a different order, combine certain operations, overlap certain operations, or the like. References in the specification to a given embodiment indicate that the embodiment described may include a particular feature, structure, or characteristic, but every embodiment may not necessarily include the particular feature, structure, or characteristic.

In addition, terms such as "right", "left", "vertical", "horizontal", "top", "bottom", "upper", "lower", "under", "below", "underlying", "over", "overlying", "parallel", "perpendicular", etc., used herein are understood to be relative locations as they are oriented and illustrated in the drawings (unless otherwise indicated). Terms such as "touching", "on", "in direct contact", "abutting", "directly adjacent to", etc., mean that at least one element physically contacts another element (without other elements separating the described elements).

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

Having described our invention, what we now claim is as follows:

1. A method for fabrication a metal insulator metal capacitor comprising:
   forming a first dielectric layer on a substrate, the first dielectric layer having a trench feature;
   forming a bottom capacitor plate in a lower portion of the trench, the bottom capacitor plate having an extended top face, wherein the extended top face extends upwards in a central region of the bottom capacitor plate metal relative to side regions of the capacitor plate;
   forming a high-k dielectric layer over the extended top face of the bottom capacitor plate; and
   forming a top capacitor plate in a top, remainder portion of the trench on top of the high-k dielectric layer.

2. The method as recited in claim 1, further comprising:
   forming a second dielectric layer over the first dielectric layer; and
   forming a contact formed through the second dielectric layer electrically contacting the top capacitor plate.

3. The method as recited in claim 2, further comprising forming a second barrier layer disposed between the contact and the second dielectric layer.

4. The method as recited in claim 2, further comprising:
   forming a first barrier layer disposed between the first dielectric layer and the bottom capacitor plate;
   forming a contact metal forming the contact; and
   forming a second barrier layer disposed between the contact metal and the second dielectric layer.

5. The method as recited in claim 1, further comprising forming the high-k dielectric layer to separate the top capacitor plate from the first dielectric layer.

6. The method as recited in claim 1, further comprising forming the extended top face of the bottom capacitor plate to have a rounded profile.

7. The method as recited in claim 1, further comprising forming the extended top face of the bottom capacitor plate to have a ridge line profile.

8. The method as recited in claim 1, wherein the high-k dielectric is selected from the group of $HfO_2$, $HfO_4Si$, $ZrSiO_4$, $ZrO_2$, $Al_2O_3$ and $Y_2O_3$.

9. The method as recited in claim 1, wherein the bottom capacitor plate is comprised of a metal selected from the group of Cu, Al, Co, W, Ru, Ni, and their alloys.

10. The method as recited in claim 1, wherein the top capacitor plate is comprised of a metal selected from the group of Cu, Al, Co, W, Ru, Ni, and their alloys.

11. The method as recited in claim 1, wherein a thickness of the high-k layer covers the bottom capacitor plate and is in the range of 0.5 nm to 20 nm.

12. The method as recited in claim 1, wherein the bottom capacitor plate and the top capacitor plate comprise copper.

13. The method as recited in claim 1, further comprising a planarization process to cause a top surface of the top capacitor plate to be planar and coplanar to a top surface of the first dielectric layer.

* * * * *